US008407656B2

(12) United States Patent
Hook et al.

(10) Patent No.: US 8,407,656 B2
(45) Date of Patent: Mar. 26, 2013

(54) METHOD AND STRUCTURE FOR A TRANSISTOR HAVING A RELATIVELY LARGE THRESHOLD VOLTAGE VARIATION RANGE AND FOR A RANDOM NUMBER GENERATOR INCORPORATING MULTIPLE ESSENTIALLY IDENTICAL TRANSISTORS HAVING SUCH A LARGE THRESHOLD VOLTAGE VARIATION RANGE

(75) Inventors: Terence B. Hook, Jericho, VT (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/167,826

(22) Filed: Jun. 24, 2011

(65) Prior Publication Data

US 2012/0326752 A1    Dec. 27, 2012

(51) Int. Cl.
*G06F 17/50* (2006.01)
(52) U.S. Cl. .................. 716/136; 716/100; 716/132
(58) Field of Classification Search .............. 716/100, 716/132, 136
See application file for complete search history.

(56) References Cited

U.S. PATENT DOCUMENTS

| | | | |
|---|---|---|---|
| 4,766,516 A | 8/1988 | Ozdemir et al. | |
| 5,072,138 A | 12/1991 | Slemmer et al. | |
| 5,121,335 A | 6/1992 | Barouch et al. | |
| 5,336,624 A | 8/1994 | Walden | |
| 5,930,663 A | 7/1999 | Baukus et al. | |
| 6,161,213 A | 12/2000 | Lofstrom | |
| 6,320,222 B1 * | 11/2001 | Forbes et al. | 257/331 |
| 6,509,217 B1 | 1/2003 | Reddy | |
| 7,191,953 B2 | 3/2007 | Wu et al. | |
| 7,291,507 B2 | 11/2007 | Bidermann et al. | |
| RE40,188 E | 3/2008 | Lofstrom | |
| 7,690,024 B2 | 3/2010 | Kinoshita et al. | |

(Continued)

FOREIGN PATENT DOCUMENTS

| | | |
|---|---|---|
| EP | 0812013 A2 | 10/1997 |
| JP | 61113194 A | 5/1986 |

OTHER PUBLICATIONS

Su et al., "A Digital 1.6 pJ/bit Chip Identification Circuit Using Process Variations," III Journal of Solid-State Circuits, vol. 43, No. 1, Jan. 2008.

(Continued)

*Primary Examiner* — Vuthe Siek
(74) *Attorney, Agent, or Firm* — Gibb & Riley, LLC; David A. Cain, Esq.

(57) ABSTRACT

Disclosed are a design method and structure for a transistor having a relatively large threshold voltage (Vt) variation range due to exacerbated random dopant fluctuation (RDF). Exacerbated RDF and, thereby a relatively large Vt variation range, is achieved through the use of complementary doping in one or more transistor components and/or through lateral dopant non-uniformity between the channel region and any halo regions. Also disclosed are a design method and structure for a random number generator, which incorporates multiple pairs of essentially identical transistors having such a large Vt variation and which relies on Vt mismatch in pairs of those the transistors to generate a multi-bit output (e.g., a unique identifier for a chip or a secret key). By widening the Vt variation range of the transistors in the random number generator, detecting Vt mismatch between transistors becomes more likely and the resulting multi-bit output will be more stable.

25 Claims, 8 Drawing Sheets

U.S. PATENT DOCUMENTS

2007/0278557 A1* 12/2007 Chen et al. .................. 257/315
2008/0116527 A1   5/2008 Hook et al.
2009/0091351 A1   4/2009 Bueti et al.
2009/0302388 A1* 12/2009 Cai et al. ..................... 257/351

OTHER PUBLICATIONS

Lee et al., "A Technique to Build a Secret Key in Integrated Circuits for Identification and Authentication Applications," MIT Computer Science and Artificial Intelligence Lab, Cambridge, MA, VLSI Circuits, 2004, 4 pages.

Holcomb et al., "Initial SRAM State as a Fingerprint and Source of True Random Numbers For RFID Tags," University of Massachusetts, Amherst, MA, 2007.

Usami et al., "An SOI-Based 7.5 um-Thick 0.15x0.15mm2 RFID Chip," IEEE International Solid-State Circuits Conference, Feb. 2006, 10 pages.

Usami et al., "A 0.05x0.05mm2 RFID Chip with Easily Scaled-Down ID-Memory," IEEE International Solid-State Circuits Conference, Feb. 2007, 2 pages.

Hook et al., "Channel Length and Threshold Voltage Dependence of Transistor Mismatch in a 32-nm HKMG Technology," IEEE Transactions on Electron Devices, 2010, 7 pages.

IBM, U.S. Appl. No. 12/823,278, filed Jun. 25, 2010.

* cited by examiner

METHOD AND STRUCTURE FOR A TRANSISTOR HAVING A RELATIVELY LARGE THRESHOLD VOLTAGE VARIATION RANGE AND FOR A RANDOM NUMBER GENERATOR INCORPORATING MULTIPLE ESSENTIALLY IDENTICAL TRANSISTORS HAVING SUCH A LARGE THRESHOLD VOLTAGE VARIATION RANGE

BACKGROUND

1. Field of the Invention

The embodiments disclosed herein relate to a design method and structure for a transistor having a relatively large threshold voltage variation range due to exacerbated random dopant fluctuation (RDF). The embodiments also relate to a design method and structure for a random number generator, which incorporates multiple essentially identical transistors having such a large threshold voltage variation range.

2. Description of the Related Art

The multi-bit output of an on-chip random number generator may be used, for example, as a unique identifier for the chip, as a secret key, etc. Thus, it is important that the multi-bit output is stable (i.e., repeatable); however, achieving such stability can be difficult. Specifically, a random number generator typically comprises multiple pairs of essentially identical transistors. It can further incorporate multiple comparators, where each comparator receives voltage outputs from a corresponding pair of the transistors, performs a comparison of the voltage outputs and, based on the comparison, outputs a binary digit (bit) (e.g., a "1" or a "0"). The bits generated by all of the comparators can provide a random multi-bit output and, depending upon the number of pairs, this random multi-pit output may be very unique. Alternatively, rather than having one comparator for each pair of transistors, the random number generator can comprise a lesser number of comparators (e.g., only a single comparator) and one or more multiplexors that allow the voltage outputs from select pairs of transistors to be compared by the comparator for purposes of generating a unique multi-bit output (e.g., see U.S. patent application Ser. No. 12/823,278 filed on Jun. 25, 2010, assigned to International Business Machines, Inc. and incorporated herein by reference). In any case, such random number generators generally rely on detection, by a comparator, of threshold voltage mismatch in a pair of essentially identical transistors as a result of process variations in order to create each bit in the multi-bit output. However, if the threshold voltage mismatch is only minimal, detecting it can be difficult and the multi-bit output may not be stable (i.e., the value of some bits within the multi-bit output may change, for example, on environmental conditions at the time of detection).

SUMMARY

In view of the foregoing, disclosed herein are embodiments of a design method and structure for a transistor having a relatively large threshold voltage variation range due to exacerbated random dopant fluctuation (RDF). Specifically, exacerbated RDF and, thereby a relatively large threshold voltage variation range, is achieved through the use of complementary doping in one or more of the transistor components and/or through lateral dopant non-uniformity within the transistor and, particularly, between the channel region and any halo regions. Also disclosed herein are embodiments of a design method and structure for a random number generator, which incorporates multiple pairs of essentially identical transistors having such a large threshold voltage variation and which relies on threshold voltage mismatch in pairs of the transistors to generate a multi-bit output. By exacerbating the RDF associated with the transistors in the random number generator and, thereby widening the threshold voltage variation range of those transistors, detecting threshold voltage mismatch between transistors becomes more likely and the resulting multi-bit output will be more stable (i.e., the value of the bits within the multi-bit output will be repeatable).

More particularly, disclosed herein are embodiments of a design method for a transistor. The design method for the transistor can comprise accessing an initial design for a transistor. As initially designed, this transistor can have a nominal threshold voltage and a range for threshold voltage variation. The initial design can then be altered to generate an updated design where the range for threshold voltage variation for the transistor is widened as a function of an increase in random dopant fluctuation (RDF) without changing the nominal threshold voltage. This altering process can be performed by changing the transistor specifications to provide for complementary doping (i.e., inclusion of both a first type conductivity dopant and a second type conductivity dopant) in one or more components of the transistor so as to increase the RDF without changing the net conductivity of the component(s). Additionally or alternatively, this altering process can comprise changing the transistor specifications to provide for lateral dopant non-uniformity within the transistor and, particularly, between the channel region and halo region(s) so as to further increase the RDF.

Also disclosed herein are embodiments of a transistor structure, the design for which initially included or was updated, as discussed above, to include features that provide for exacerbated RDF and, thereby a relatively large threshold voltage variation range. Specifically, RDF can be exacerbated by complementary doping (i.e., inclusion of both a first type conductivity dopant and a second type conductivity dopant) in one or more components of the transistor. For example, the transistor can comprise source/drain regions having a first type conductivity, a channel region between the source/drain regions, and a halo region positioned between the channel region and one of the source/drain regions. This halo region can be doped with both a first type conductivity dopant and a second type conductivity dopant such that the conductivity type of the halo region is different than that of the source/drain regions (i.e., the second type conductivity). Additionally or alternatively, RDF can be exacerbated by lateral dopant non-uniformity within the transistor and, particularly, between the channel region and any halo regions. Transistors with exacerbated RDF and, thereby with a relatively large threshold voltage variation range can be incorporated into a circuit, such as a random number generator, in which the ability to detect threshold voltage mismatch in pair(s) of essentially identical transistors is beneficial.

Also disclosed herein are embodiments of a design method for a random number generator. The design method for the random number generator can comprise accessing an initial design for a random number generator. As initially designed, the random number generator can comprise multiple pairs of essentially identical transistors, which have a same nominal threshold voltage and a same range for threshold voltage variation. The random number generator can further comprise at least one comparator that receives voltage outputs from a pair of the transistors, performs a comparison of the voltage outputs and, based on the comparison, outputting a binary digit (bit). Such a random number generator relies on detection, by comparator(s), of threshold voltage mismatch between pairs of transistors as a result of process variations in order to create bits for a multi-bit output. The initial design can then be altered to generate an updated design where the range for threshold voltage variation for each of the essentially identical transistors is widened as a function of an increase in random dopant fluctuation (RDF) without changing the nominal threshold voltage. This altering process can be performed by changing the transistor specifications to provide for complementary doping (i.e., inclusion of both a first type conductivity dopant and a second type conductivity dopant) in one or more components of the transistors so as to increase the RDF without changing the net conductivity of the component(s). Additionally or alternatively, this altering process can comprise changing the transistor specifications to provide for lateral dopant non-uniformity within the transistors and, particularly, between the channel region and halo region(s) of the transistors so as to further increase the RDF. By exacerbating the RDF associated with the transistors in the random number generator and, thereby increasing (i.e., widening) the threshold voltage variation range of those transistors, detecting threshold voltage mismatch in pairs of transistors becomes more likely and the resulting multi-bit output will be more stable (i.e., the value of the bits within the multi-bit output will be repeatable).

Also disclosed herein are embodiments of a random number generator structure, the design for which initially included or was updated, as discussed above, to include, transistors with features that provide for exacerbated RDF and, thereby a relatively large threshold voltage variation range. Specifically, this random number generator can comprise multiple pairs of essentially identical transistors with exacerbated RDF and at least one comparator that receives voltage outputs from a pair of the transistors, performs a comparison of the voltage outputs and, based on the comparison, outputs a binary digit (bit). Such a random number generator relies on detection, by the comparator(s), of threshold voltage mismatch in pairs of transistors as a result of process variations in order to create bits for a multi-bit output. RDF within the transistors can be exacerbated by complementary doping (i.e., inclusion of both a first type conductivity dopant and a second type conductivity dopant) in one or more components of the transistors. For example, each transistor can comprise source/drain regions having a first type conductivity, a channel region between the source/drain regions, and a halo region positioned between the channel region and one of the source/drain regions. This halo region can be doped with both a first type conductivity dopant and a second type conductivity dopant such that the conductivity type of the halo region is different from that of the source/drain regions (i.e., second type conductivity). Additionally or alternatively, RDF can be exacerbated by lateral dopant non-uniformity within the transistors and, particularly, between the channel region and any halo regions.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

Figure 1:
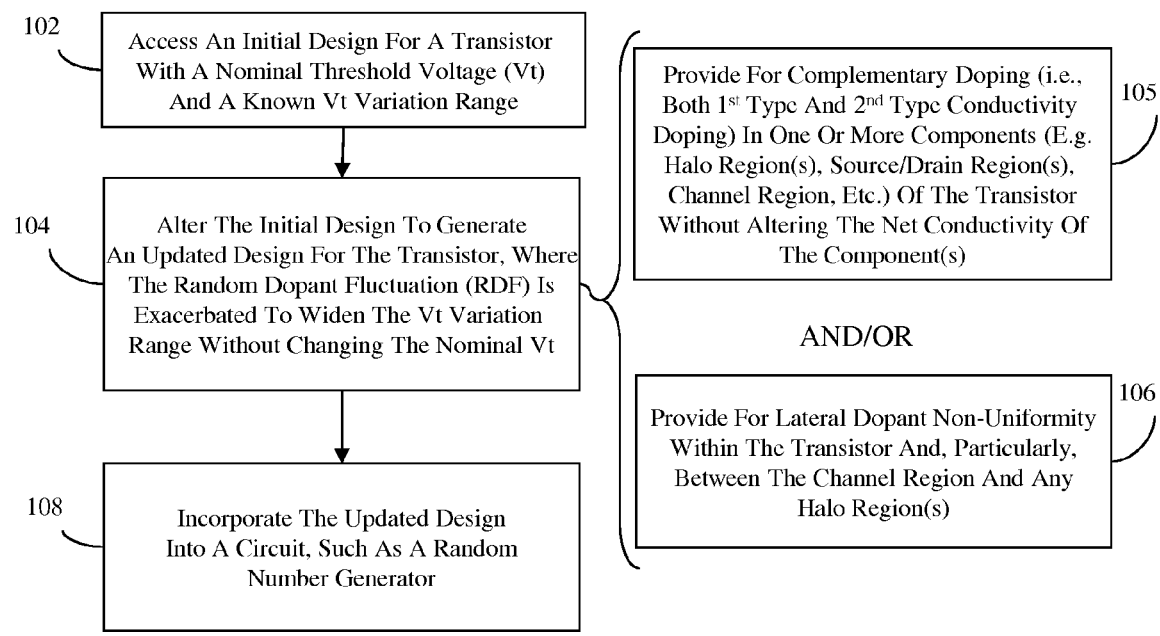
FIG. 1 is a flow diagram illustrating an embodiment of a design method for a transistor.

The embodiments of the invention and the various features and advantageous details thereof are explained more fully with reference to the non-limiting embodiments that are illustrated in the accompanying drawings and detailed in the following description.

As mentioned above, the multi-bit output of an on-chip random number generator may be used, for example, as a unique identifier for the chip, as a secret key, etc. Thus, it is important that the multi-bit output is stable (i.e., repeatable); however, achieving such stability can be difficult. Specifically, a random number generator typically comprises multiple pairs of essentially identical transistors. It can further incorporate multiple comparators, where each comparator receives voltage outputs from a corresponding pair of the transistors, performs a comparison of the voltage outputs and, based on the comparison, outputs a binary digit (bit) (e.g., a "1" or a "0"). The bits generated by all of the comparators can provide a random multi-bit output and, depending upon the number of pairs, this random multi-pit output may be very unique. Alternatively, rather than having one comparator for each pair of transistors, the random number generator can comprise a lesser number of comparators (e.g., only a single comparator) and one or more multiplexors that allow the voltage outputs from select pairs of transistors to be compared by the comparator for purposes of generating a unique multi-bit output (e.g., see U.S. patent application Ser. No. 12/823, 278 filed on Jun. 25, 2010, assigned to International Business Machines, Inc. and incorporated herein by reference). In any case, such random number generators generally rely on detection, by a comparator, of threshold voltage mismatch in a pair of essentially identical transistors as a result of process variations in order to create each bit in the multi-bit output. However, if the threshold voltage mismatch is only minimal, detecting it can be difficult and the multi-bit output may not be stable (i.e., the value of some bits within the multi-bit output may change depending, for example, on the environmental conditions at the time of detection).

In view of the foregoing disclosed herein are embodiments of a design method and structure for a transistor having a relatively large threshold voltage variation range due to exacerbated (i.e., increased or maximized) random dopant fluctuation (RDF). Specifically, exacerbated RDF and, thereby a relatively large threshold voltage variation range, is achieved through the use of complementary doping in one or more of the transistor components (e.g., the channel region, source/drain region(s), halo region(s), gate structure, etc.) and/or through lateral dopant non-uniformity within the transistor and, particularly, between the channel region and any halo regions. Also disclosed are embodiments of a design method and structure for a random number generator, which incorporates multiple pairs of essentially identical transistors having such a large threshold voltage variation and which relies on threshold voltage mismatch in pairs of the transistors to generate a multi-bit output that can be used, for example, as a unique chip identifier or a secret key. By exacerbating the RDF associated with the transistors in the random number generator and, thereby widening the threshold voltage variation range of those transistors, detecting threshold voltage mismatch in pairs of transistors becomes more likely and the resulting multi-bit output will be more stable (i.e., the value of the bits within the multi-bit output will be repeatable). Furthermore, a very broad range of threshold voltage variation can enable multiple states from a single bit.

Figure 2:
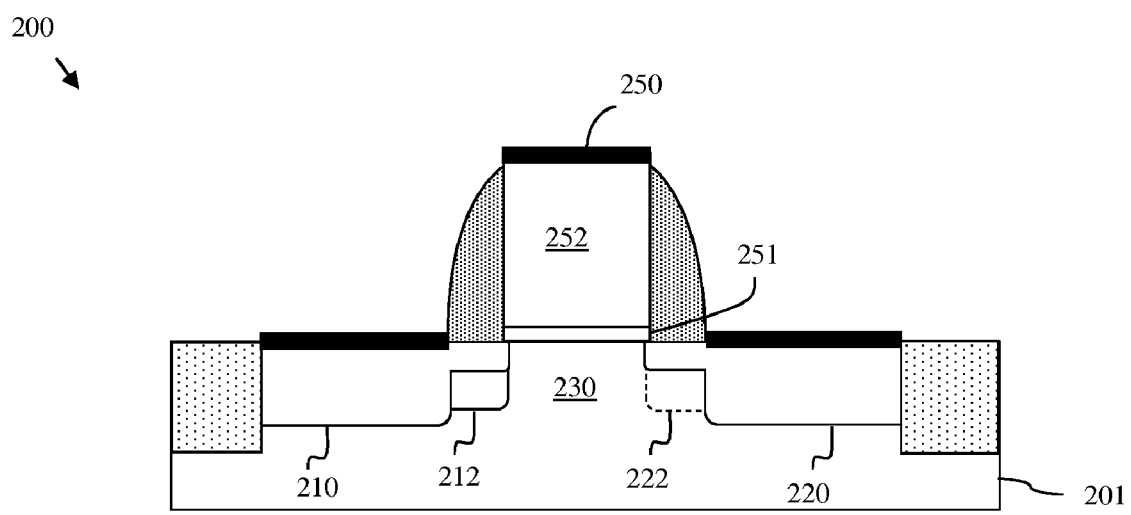
FIG. 2 is a cross-section diagram illustrating an exemplary initial design for a transistor without exacerbated random dopant fluctuation (RDF)

More particularly, referring to FIG. 1, disclosed herein are embodiments of a design method for a transistor. The design method for the transistor can comprise accessing (e.g., by a computer system from memory) an initial design for a transistor 200 (102, see FIG. 2). For illustration purposes, this transistor 200 is shown in FIG. 2 as a single-gated symmetric planar field effect transistor (FET). However, FIG. 2 is not intended to be limiting and, thus, the transistor 200 can, alternatively, comprise an asymmetric planar FET, a non-planar multi-gated field effect transistor (MUGFET), such as a dual-gated or tri-gated, single-fin or multi-fin, field effect transistor, etc.

In any case, as initial designed, this FET 200 can comprise a semiconductor layer 201 (e.g., a silicon layer) that comprises at least source/drain regions 210, 220 and a channel region 230 positioned between the source/drain regions 210, 220. Those skilled in the art will recognize that various different configurations for FET source/drain regions and channel regions are well-known in the art and may be included in the initial design for the transistor 200. For example, as initially designed, the source/drain regions may comprise dopant implant regions, recesses filled with in-situ doped or subsequently implanted epitaxial semiconductor material, raised source/drain regions, lightly doped source/drain extension regions in combination with heavily doped deep source/drain regions, etc. Additionally, as initially designed, the channel region can comprise an implanted well region, can optionally be separated from the source/drain regions 210, 220 by halo regions 212, 222, etc. The FET 200 can further comprise a gate structure 250 (e.g., a gate dielectric layer 251-gate conductor layer 252 stack) adjacent to the channel region 230.

Regardless of the configuration, in the transistor 200, the source/drain regions 210, 220 can have a first type conductivity and the channel region 230 and any halo regions 212, 222 can have the second type conductivity. Typically, halo regions 212, 2222 will have a higher conductivity level of the same type as the channel region 230 (i.e., halo regions 212, 222 will have a higher concentration of the same type dopant). Optionally, the gate conductor layer 252 of the gate structure 250 can comprise a polysilicon layer that also has the first type conductivity.

It should be understood that, for purposes of this disclosure, the "first type conductivity" and "second type conductivity" as referred to herein will differ depending upon whether the field effect transistor 200 is an N-type FET (NFET) or a P-type FET (PFET). Specifically, for an NFET, the first type conductivity refers to an N-type conductivity and the second type conductivity refers to a P-type conductivity. However, for a PFET the reverse is true. That is, for a PFET, the first type conductivity refers to P-type conductivity and the second type conductivity refers to P-type conductivity. Those skilled in the art will recognize that different dopants can be specified in the design to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si).

As initially designed, this transistor 200 will have a nominal threshold voltage (e.g., between 200 mV and 500 mV) and a range for threshold voltage variation (e.g., the nominal Vt+/−20 mV). The "nominal threshold voltage" as referred to herein is the expected (i.e., typical or average) threshold value achieved for transistors manufactured according to the design. The "range for threshold voltage variation" (i.e., threshold voltage variation range) as referred to herein is the extent to which the threshold voltage may vary from the nominal threshold voltage due to process variations occurring during manufacturing or, more particularly, the limits (high and low) within which the threshold voltage may vary from the nominal threshold voltage due to process variations occurring during manufacturing.

Typically, transistors are designed so as to minimize this Vt variation range in order to achieve optimal performance. However, rather than minimizing the Vt variation range, the method embodiments disclosed herein further comprise altering (e.g., by the computer system, based on a set of rules) the initial design in order to generate an updated design where the range for threshold voltage variation for the transistor 200 is actually widened (e.g., from the nominal Vt+/−20 mV to the nominal Vt+/−100 mV) as a function of an increase in random dopant fluctuation (RDF) and done so specifically without changing the nominal threshold voltage (104). That is, the altering process 104 can be performed so that the range for threshold voltage variation is widened, while the nominal threshold voltage of the transistor is retained (i.e., remains the same).

RDF can be exacerbated at process 104, for example, by changing the transistor specifications to provide for complementary doping (i.e., inclusion of both a first type conductivity dopant and a second type conductivity dopant) in one or more of the components of the transistor 200 without changing the net conductivity of the component(s) (105). Specifically, the transistor specifications can be changed to provide for complementary doping in any halo region(s) 212, 222, in the channel region 230, in the polysilicon gate conductor layer 252 of the gate structure 250 and/or in one or both of the source/drain regions 210, 220 so as to increase the RDF without changing the net conductivity of those components.

The "net conductivity" as referred to herein is the type of conductivity (i.e., first type conductivity or second type conductivity) as well as the level of conductivity (e.g., low to high). Those skilled in the art will recognize that with complementary doping, P-type conductivity can be achieved by using a greater concentration (i.e., a greater amount per volume) of P-type dopant as compared to N-type dopant and, conversely, N-type conductivity can be achieved by using a greater concentration of N-type dopant as compared to P-type dopant is used. Furthermore, those skilled in the art will recognize that, with complementary doping, the net conductivity (type and level) achieved will depend upon the balance between P-type dopants and N-type dopants. That is, to retain a P-type conductivity level in a given component, the concentration of P-type dopants must be increased proportionally with the addition of N-type dopants and vice versa. For example, an initial design for an NFET might call for P+ halo region(s) having a P-type dopant concentration of approximately $3\times10^{18}$ cm$^{-3}$. In this case, complementary doping that retains the net P+ conductivity could be achieved using a P-type dopant concentration of approximately $5\times10^{18}$ cm$^{-3}$ with an N-type dopant concentration of approximately $2\times10^{18}$ cm$^{-3}$.

Additionally or alternatively, RDF can be exacerbated at process 104 by changing the transistor specifications to provide for lateral dopant non-uniformity within the transistor 200 and, particularly, between the channel region 230 and any halo region(s) 212, 222 (106).

For example, in order to provide for lateral dopant non-uniformity, the transistor specifications can be changed to provide for a single-side halo region only (e.g., a source-side halo region 212 only) having a different level of the same type conductivity (i.e., a different dopant concentration of the same type conductivity dopant) than the channel region 230. The transistor specifications can further be changed to increase the second type conductivity level of the halo region 212 (i.e., to increase the dopant concentration in the halo region 212) such that it has an extremely high conductivity level as compared to the second type conductivity channel region 230. For example, the concentration of dopant in the halo region may be 400-800 times greater than that in the channel region. For example, the dopant concentration in the halo region may approximately $3\times10^{18}$ cm$^{-3}$, whereas the dopant concentration in the channel region may be less than $5\times10^{15}$ cm$^{-3}$. Optionally, this can be in addition to providing for complementary doping in the channel region 230 and/or the single-side halo region 212.

In order to provide lateral dopant non-uniformity, the transistor specifications could, alternatively, be changed to specify different levels of the same type conductivity for the channel region 230 and for halo region(s) 212, 222. For example, the transistor specifications can be changed to increase the second type conductivity level of the halo region(s) 212, 222 (i.e., to increase the concentration of a second type conductivity dopant in the halo regions 212, 230) such that they have an extremely high conductivity level as compared to the channel region 230. Again, for example, the concentration of dopant in the halo regions may be 400-800 times greater than that in the channel region. For example, the dopant concentration in the halo regions may approximately $3\times10^{18}$ cm$^{-3}$, whereas the dopant concentration in the channel region may be less than $5\times10^{15}$ cm$^{-3}$. Optionally, this can be in addition to providing for complementary doping in the channel region 230 and/or the halo region(s) 212, 222.

In order to provide lateral dopant non-uniformity, the transistor specifications could, alternatively, be changed to specify different type conductivities for the channel region 230 and for halo region(s) 212, 222. For example, the transistor specifications could be changed to specify that the channel region 230 has the same type conductivity as the source/drain regions 210, 220 (i.e., the first type conductivity), albeit at a lower conductivity level, and to further specify that the halo regions 212, 222 have a different conductivity type (i.e., a second conductivity type) at a relatively high conductivity level in order to compensate for the change in channel region conductivity. Again, optionally, this can be in addition to providing for complementary doping in the channel region 230 and/or the halo region(s) 212, 222.

Figure 3:
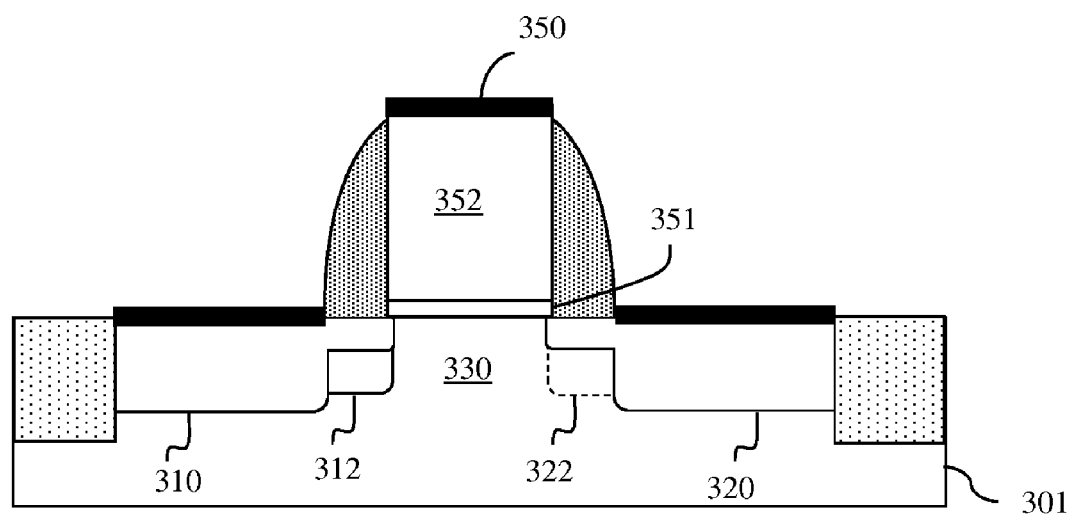
FIG. 3 is a cross-section diagram illustrating an embodiment of transistor having exacerbated RDF.

Referring to FIG. 3, also disclosed herein are embodiments of a transistor structure 300, the design for which initially included or was updated, as discussed in the design method embodiment above, to include, features that provide for exacerbated RDF and, thereby a relatively large threshold voltage variation range. As with the transistor 200 of FIG. 2, the transistor 300 is shown in FIG. 3 as a single-gated symmetric planar field effect transistor (FET). However, FIG. 3 is not intended to be limiting and, thus, the transistor 300 can, alternatively, comprise an asymmetric FET, a non-planar multi-gated field effect transistor (MUGFET), such as a dual-gated or tri-gated, single-fin or multi-fin, field effect transistor, etc.

In any case, the FET 300 can comprise a semiconductor layer 301 (e.g., a silicon layer) that comprises at least source/drain regions 310, 320, having a first type conductivity, and a channel region 330 positioned between the source/drain regions 310, 320.

Those skilled in the art will recognize that various different configurations for FET source/drain regions and channel regions are well-known in the art and may be incorporated into the transistor 300. For example, the source/drain regions may comprise dopant implant regions, recesses filled with in-situ doped or subsequently implanted epitaxial semiconductor material, raised source/drain regions, lightly doped source/drain extension regions in combination with heavily doped deep source/drain regions, etc. Furthermore, as mentioned above with regard to the method embodiments, for purposes of this disclosure, the "first type conductivity" and "second type conductivity" as referred to herein will differ depending upon whether the field effect transistor 300 is an N-type FET (NFET) or a P-type FET (PFET). Specifically, for an NFET, the first type conductivity refers to an N-type conductivity and the second type conductivity refers to a P-type conductivity. However, for a PFET the reverse is true. That is, for a PFET, the first type conductivity refers to P-type conductivity and the second type conductivity refers to P-type conductivity. Those skilled in the art will recognize that different dopants can be specified in the design to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si).

The FET 300 can further comprise a gate structure 350 (e.g., a gate dielectric layer 351-gate conductor layer 352 stack) adjacent to the channel region 330. Optionally, the gate conductor layer 352 of the gate structure 350 can, comprise a polysilicon gate conductor layer 351 that also has the first type conductivity.

In the various embodiments of this transistor 300, RDF is exacerbated (i.e., increased or maximized) by complementary doping (i.e., inclusion of both a first type conductivity dopant and a second type conductivity dopant) in one or more components of the transistor 300 and/or by lateral dopant non-uniformity within the transistor 300 and, particularly between the channel region 330 and any halo region(s) 312, 322.

Specifically, RDF can be exacerbated by complementary doping in the channel region 330, the source/drain regions 310, 320, any halo region(s) 312, 322, and/or the polysilicon gate conductor layer 351. That is, any one or more of these components 330, 310, 320, 312, 322 and 351 can be doped with both a first type conductivity dopant and a second type conductivity dopant. Those skilled in the art will recognize that the net conductivity (type and level) of the different components will vary as a function of the type of FET (i.e., NFET or PFET) and will depend upon the balance between first type conductivity dopants and second type conductivity dopants. For example, an NFET with P+ halo region(s) and complementary doping can comprise a P-type dopant at concentration of approximately $5 \times 10^{18}$ cm$^{-3}$ and an N-type dopant at a concentration of approximately $2 \times 10^{18}$ cm$^{-3}$.

Additionally, or alternatively, RDF can be exacerbated by lateral dopant non-uniformity within the transistor 300 and, particularly between the channel region 330 and any halo region(s) 312, 322.

For example, in one embodiment, the transistor 300 can comprise a channel region 330 having a different type conductivity than that of the source/drain regions 310, 320 (i.e., having a second type conductivity). The transistor 300 can further comprise only a single halo region 312 positioned between the channel region 330 and one of the source/drain regions (e.g., the source region 310). That is, in one embodiment, the transistor 300 would not include the optional halo region 322 represented in FIG. 3 by the dashed line. The single-side halo region 312 can be doped with a second type conductivity dopant such that it has the same conductivity type as the channel region 330 (i.e., the second type conductivity), but at an extremely high conductivity level as compared to the channel region 330. In other words, the single-side halo region 312 can have an extremely high concentration of a second type conductivity dopant as compared to the channel region 330. For example, the concentration of dopant in the halo region may be 400-800 times greater than that in the channel region. For example, the dopant concentration in the halo region may approximately $3 \times 10^{18}$ cm$^{-3}$, whereas the dopant concentration in the channel region may be less than $5 \times 10^{15}$ cm$^{-3}$. As discussed above, this single-side halo region 312 can also have complementary doping for exacerbated RDF.

In another embodiment, the transistor 300 can similarly comprise a channel region 330 having a different type conductivity than that of the source/drain regions 310, 320 (i.e., having a second type conductivity). The transistor 300 can further comprise symmetric halo regions 312, 322 between the channel region 330 and the source/drain regions 310, 320, respectively. The symmetric halo regions 312, 322 can be doped with a second type conductivity dopant such that they have the same conductivity type as the channel region 330 (i.e., the second type conductivity), but at an extremely higher conductivity level as compared to the channel region 330. In other words, the symmetric halo regions 312, 322 can have an extremely high concentration of a second type conductivity dopant as compared to the channel region 330. For example, the concentration of dopant in the halo regions may be 400-800 times greater than that in the channel region. For example, the dopant concentration in the halo regions may approximately $3 \times 10^{18}$ cm$^{-3}$, whereas the dopant concentration in the channel region may be less than $5 \times 10^{15}$ cm$^{-3}$. As discussed above, the symmetric halo regions 312, 322 can also have complementary doping for exacerbated RDF.

In yet another embodiment, the transistor 300 can comprise a channel region 330 having the same type conductivity as the source/drain regions 310, 320 (i.e., having a first type conductivity), albeit at a lower conductivity level. The transistor 300 can further comprise halo regions 312, 322 between the channel region 330 and the source/drain regions 310, 320, respectively. The halo regions 312, 322 can be doped with a second type conductivity dopant such that they have a relatively high second type conductivity level so as to compensate for the first type conductivity of the channel region 330. In other words, the symmetric halo regions 312, 322 can have a different conductivity type than the channel region 330 and, thereby lateral dopant non-uniformity with respect to the channel region 330 for exacerbated RDF. Optionally, as discussed above, the halo regions 312, 322 and/or the channel region 330 can also have complementary doping for exacerbated RDF.

It should be noted that various different halo region configurations are well-known in the art and can be incorporated into the transistor structure 300. As shown in FIG. 3, each of the halo region(s) 312, 322 may be positioned laterally adjacent to a deep source/drain region and below a shallow source/drain extension region. However, FIG. 3 is not intended to be limiting. Alternatively, each of the halo region(s) 312, 322 may border the entire source/drain region (not shown), may border the shallow source/drain extension region only (not shown), etc.

Transistors with exacerbated RDF and, thereby with a relatively large threshold voltage variation range can be incorporated into any circuit, such as a random number generator, in which the ability to detect threshold voltage mismatch in pair(s) of essentially identical transistors is beneficial.

Figure 4:
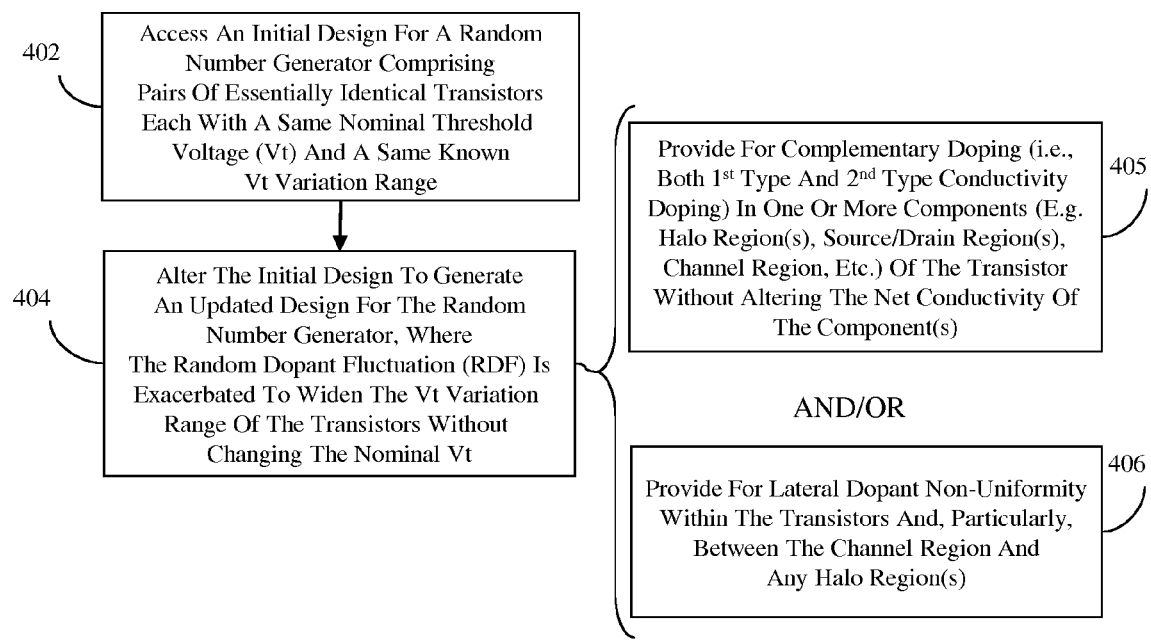
FIG. 4 is a flow diagram illustrating a design method for a random number generator.

Referring to FIG. 4, also disclosed herein are embodiments of a design method for a random number generator. The design method for the random number generator can comprise accessing (e.g., by a computer system from memory) an initial design for a random number generator 500 (402, see FIG. 5). The random number generator 500 can comprise multiple pairs $501_{1-n}$, of essentially identical transistors, each of which have a same nominal threshold voltage (e.g., between 200 mV and 500 mV) and a same range for threshold voltage variation (e.g., the nominal Vt+/−20 mV). Each transistor in the initial design can be configured in the same manner as the transistor 200 of FIG. 2, which is described in detail above. The random number generator 500 can further comprise at least one comparator 520 that receives voltage outputs from a pair of the transistors, performs a comparison of the voltage outputs and, based on the comparison, outputting a binary digit (bit) (i.e., a "0" or "1").

Figure 5:
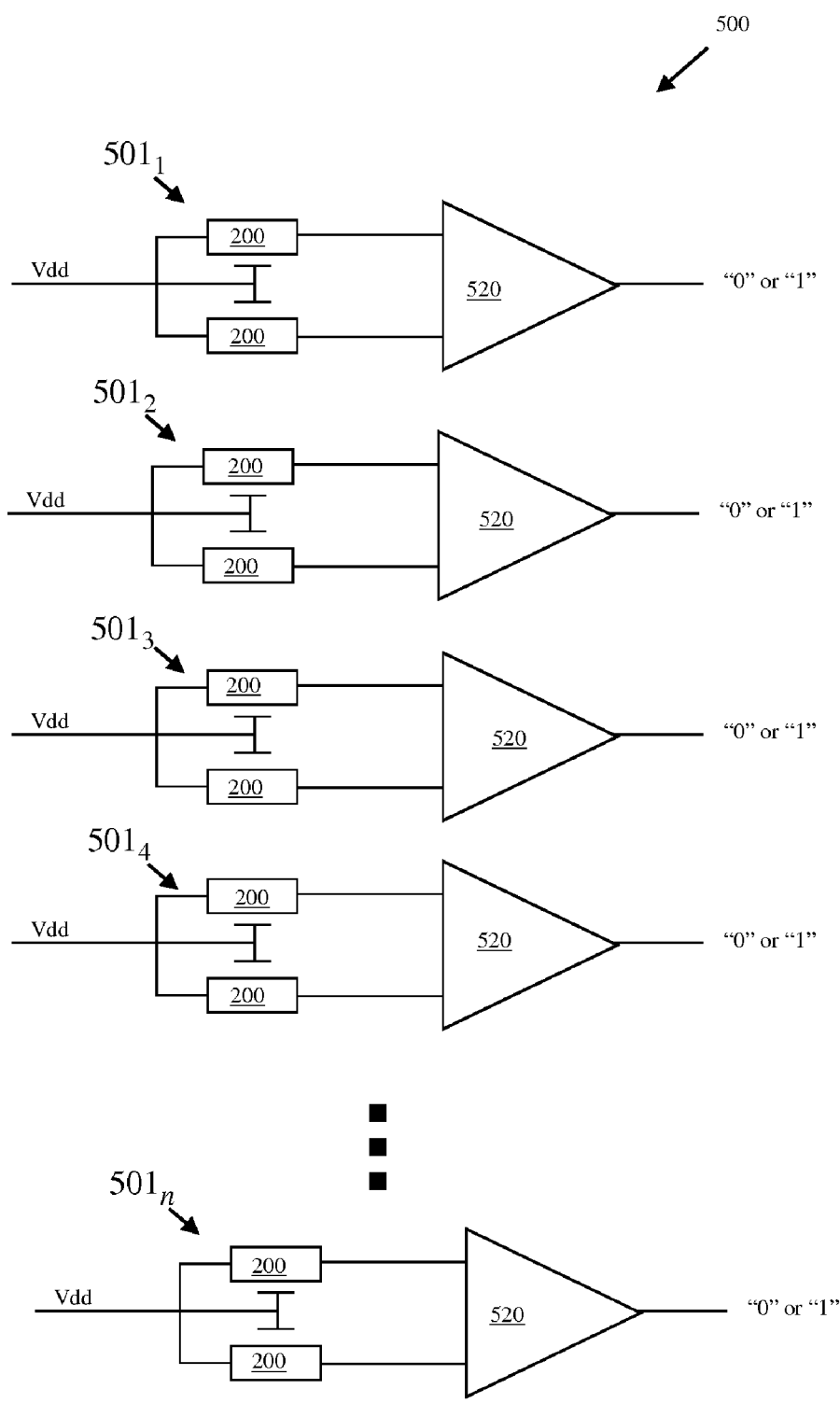
FIG. 5 is a cross-section diagram illustrating an exemplary initial design for random number generating incorporating transistors without exacerbated random dopant fluctuation (RDF)

Specifically, in one embodiment, the random number generator 500 can comprise multiple comparators 520, where each comparator receives voltage outputs from a corresponding pair $501_{1-n}$, of the transistors 200, performs a comparison of the voltage outputs and, based on the comparison, outputs a binary digit (bit) (e.g., a "1" or a "0"). The bits generated by all of the comparators can provide a random multi-bit output and, depending upon the number of pairs, this random multi-pit output may be very unique. Alternatively, rather than having one comparator for each pair of transistors, as shown in FIG. 5, the random number generator 500 can comprise a lesser number of comparators (e.g., only a single comparator) and one or more multiplexors that allow the voltage outputs from select pairs of transistors to be compared by the comparator for purposes of generating a unique multi-bit output, as described in detail in U.S. Patent application Ser. No. 12/823,278 incorporated by reference above. It should be noted that the random number generator configurations described above are offered for illustration purposes and are not intended to be limiting. Thus, the initial design for the random number generator can be any random number generator design that relies on detection, by comparator(s), of threshold voltage mismatch in pairs of essentially identical transistors as a result of process variations in order to create each bit in a multi-bit output.

Next, the initial design for the random number generator 500 can be altered (e.g., by the computer system based on a set of rules) to generate an updated design where the range for threshold voltage variation for each of the essentially identical transistors 200 is widened (e.g., from the nominal Vt+/−20 mV to the nominal Vt+/−100 mV) as a function of an increase in random dopant fluctuation (RDF) without changing the nominal threshold voltage (404). That is, the altering process can be performed so that, although the range for threshold voltage variation is widened, the nominal threshold voltage of the transistors is retained (i.e., remains the same).

RDF of the transistors can be exacerbated at process 404, for example, by changing the transistor specifications to provide for complementary doping (i.e., inclusion of both a first type conductivity dopant and a second type conductivity dopant) in one or more of the components of each of the transistors 200 without changing the net conductivity of the component(s) (405). Specifically, the transistor specifications to provide for complementary doping in any halo region(s) 212, 222, in the channel region 230, in the polysilicon gate conductor layer 252 of the gate structure 250 and/or in one or both of the source/drain regions 210, 220 in the transistors 200 so as to increase the RDF without changing the net conductivity of those components, as described in detail above with regard to process step 105 of FIG. 1. Additionally or alternatively, RDF can be exacerbated at process 404 by changing the transistor specifications to provide for lateral dopant non-uniformity within each of the transistors 200 and, particularly, between the channel region 230 and any halo region(s) 212, 222 in the transistors 200 (406), in the same manner as described in detail above with regard to process step 106 of FIG. 1. It should be noted that any of these techniques that provide for lateral dopant non-uniformity can be performed in addition to providing for complementary doping in the channel region 230 and/or any halo region(s) 212, 222.

Figure 6:
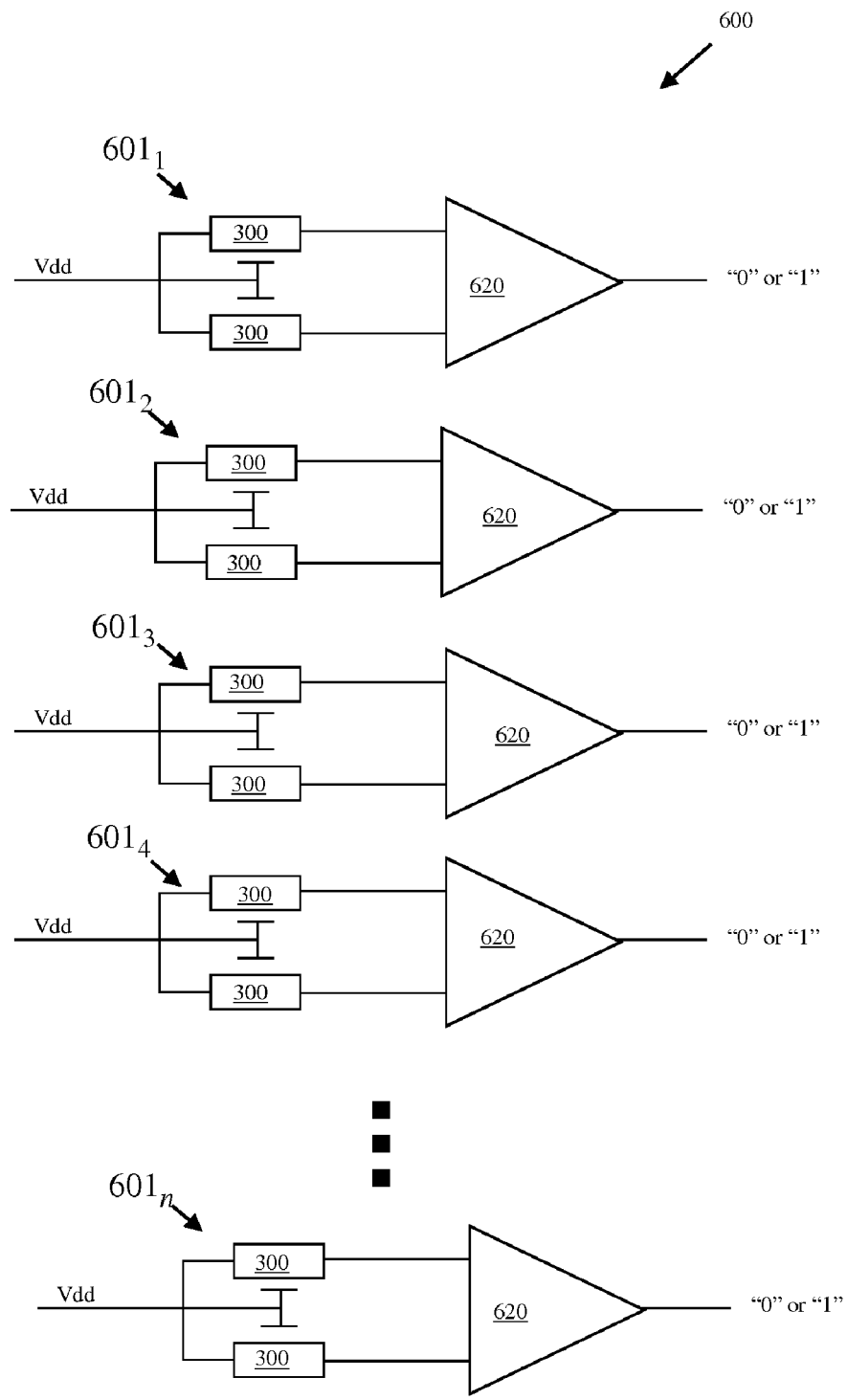
FIG. 6 is a cross-section diagram illustrating an embodiment of random dopant generator incorporating transistors having exacerbated RDF.

Referring to FIG. 6, also disclosed herein are embodiments of a random number generator structure 600, the design for which initially included or was updated, as discussed above, to include, transistors with features that provide for exacerbated RDF and, thereby a relatively large threshold voltage variation range. Specifically, this random number generator 600 can be configured in essentially the same manner as the random number generator 500 of FIG. 5. That is, it can comprise multiple pairs 601$_{1-n}$, of essentially identical transistors, which have a same nominal threshold voltage (e.g., between 200 mV and 500 mV) and a same range for threshold voltage variation. The random number generator 600 can further comprise at least one comparator 620 that receives voltage outputs from a pair of the transistors, performs a comparison of the voltage outputs and, based on the comparison, outputs a binary digit (bit) (i.e., a "0" or "1"). Such a random number generator 600, like the random generator 500 of FIG. 5, relies on detection, by comparator(s) 620, of threshold voltage mismatch in pairs of transistors as a result of process variations in order to create bits for a multi-bit output. However, unlike the random number generator 500 of FIG. 6, the random generator 600 of FIG. 6 is configured with transistors, such as any of the transistor 300 embodiments described in detail above and illustrated in FIG. 3, with features that provide for exacerbated RDF and, thereby a relatively large threshold voltage variation range (e.g., nominal Vt+/−100 mV). For example, each transistor 300 in the random number generator 600 of FIG. 6 can comprise one or more components (e.g., a channel region 330, halo region(s) 312 and/or 322, a gate conductor layer 351 of a gate structure 350, and/or source/drain region(s) 310, 320) with complementary doping for exacerbated RDF, as discussed in detail above. Additionally or alternatively, each transistor 300 in the random number generator 600 of FIG. 6 can comprise a channel region 330 having lateral dopant non-uniformity with respect to any halo regions 312, 322 for exacerbated RDF, as discussed in detail above.

Figure 7:
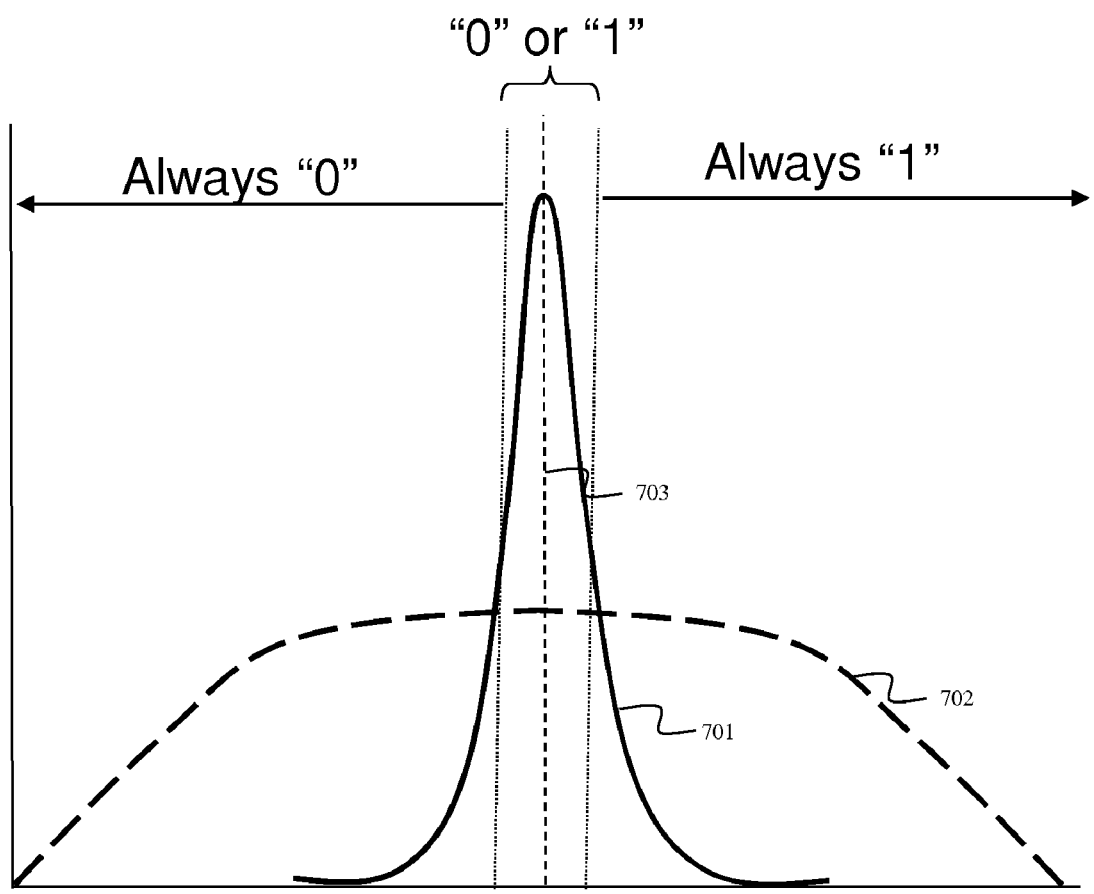
FIG. 7 is a graph with curves illustrating the increased likelihood that a random number generator such as that shown in FIG. 6, as compared to a random number generator such as that shown in FIG. 5, will detect threshold voltage (Vt) mismatch between pairs of transistors.

Referring to the graph of FIG. 7, the curves 701 and 702 illustrate generally the proportion of pairs of FETs that will always result in a "1" output, that will always result in a "0" output and that may vary depending upon whether the random number generator is designed with FETs having a relatively small range of Vt variation around a nominal Vt 703 (e.g., see the random generator 500 of FIG. 5 described in detail above) or whether the random number generator is designed with FETs having a maximized range of Vt variation around the same nominal Vt 703 (e.g., see the random number generator 600 of FIG. 6 described in detail above), respectively. Specifically, the curve 701 illustrates that a random number generator with FETs having a maximized Vt variation range will have proportionally more pairs of FETs that when challenged will always result in a "1" output, proportionally more pairs of FETs that when challenged will always result in a "0" output and proportionally less pairs of FETs that when challenged will produce unreliable results as compared to a random number generator with FETs having a lesser Vt variation range. Thus, by exacerbating the RDF associated with transistors 300 in the random number generator 600 and, thereby increasing (i.e., widening) the threshold voltage variation range of those transistors 300, detecting threshold voltage mismatch in the pairs 601$_{1-n}$, of transistors becomes more likely and the resulting multi-bit output will be more stable (i.e., the value of the bits within the multi-bit output will be repeatable).

Also disclosed herein are embodiments of a system and a program storage device for implementing the above described embodiments. More particularly, as will be appreciated by one skilled in the art, aspects of the disclosed design method embodiments may be implemented using a computer system or program storage device (i.e., a computer program product). Accordingly, aspects of the disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed embodiments may take the form of a computer program product embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
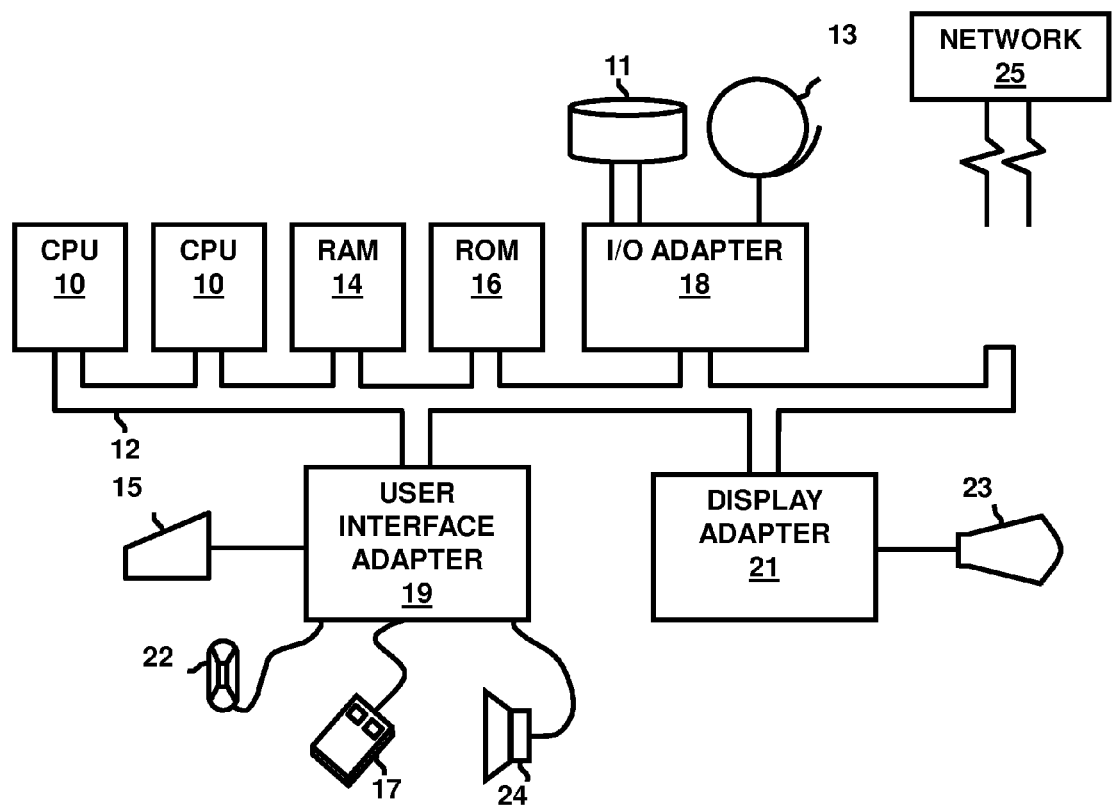
FIG. 8 is an exemplary hardware environment that can be used to implement the disclosed design method embodiments.

A representative hardware environment for practicing the disclosed embodiments is depicted in FIG. 8. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology disclosed. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description above has been presented for purposes of illustration and description, but is not intended to be exhaustive or limited to the embodiments in the form disclosed. Many modifications and variations to the disclosed embodiments will be apparent to those of ordinary skill in the art without departing from the scope and spirit of the disclosed embodiments.

Disclosed above are embodiments of a design method and structure for a transistor having a relatively large threshold voltage variation range due to exacerbated (i.e., increased or maximized) random dopant fluctuation (RDF). Specifically, exacerbated RDF and, thereby a relatively large threshold voltage variation range, is achieved through the use of complementary doping in one or more of the transistor components (e.g., the channel region, source/drain region(s), halo region(s), gate structure, etc.) and/or through lateral dopant non-uniformity within the transistor and, particularly, between the channel region and any halo regions. Also disclosed above are embodiments of a design method and structure for a random number generator, which incorporates multiple pairs of essentially identical transistors having such a large threshold voltage variation and which relies on threshold voltage mismatch in pairs of the transistors to generate a multi-bit output that can be used, for example, as a unique chip identifier or a secret key. By exacerbating the RDF associated with the transistors in the random number generator and, thereby widening the threshold voltage variation range of those transistors, detecting threshold voltage mismatch in pairs of transistors becomes more likely and the resulting multi-bit output will be more stable (i.e., the value of the bits within the multi-bit output will be repeatable). Furthermore, a very broad range of threshold voltage variation can enable multiple states from a single bit. Another advantage of the disclosed technique is that oftentimes the implant required for achieving complementary doping may already be available in the standard CMOS processing. For example, for NFETs, implants already required for PFET processing can be used to achieve complementary doping in one or more of the transistor components and vice versa for PFETs.

What is claimed is:

1. A computer-implemented design method comprising:
    accessing, by a computer from memory, an initial design for a transistor, said transistor having a nominal threshold voltage and a range for threshold voltage variation; and
    altering, by said computer, said initial design for said transistor in order to generate an updated design for said transistor by changing specifications for said transistor so that said range for threshold voltage variation for said transistor is widened as a function of an increase in random dopant fluctuation and so that said nominal threshold voltage of said transistor is retained.

2. The design method of claim 1, said altering comprising providing for complementary doping in at least one component of said transistor so as to increase said random dopant fluctuation without changing a net conductivity of said component.

3. The design method of claim 2, said component comprising a halo region.

4. The design method of claim 2, said component comprising a channel region.

5. The design method of claim 2, said component comprising a source/drain region.

6. The design method of claim 1, said altering comprising providing for lateral dopant non-uniformity between a channel region and at least one halo region adjacent to said channel region so as to increase said random dopant fluctuation.

7. The design method of claim 6, said providing for lateral dopant non-uniformity comprising any one of:
    specifying different levels of a same type conductivity for said channel region and said halo region; and
    specifying different type conductivities for said channel region and said halo region.

8. A computer-implemented design method comprising:
    accessing, by a computer from memory, an initial design for a random number generator, said random number generator comprising:
        multiple pairs of transistors, said transistors having a same nominal threshold voltage and a same range for threshold voltage variation; and
        a comparator receiving voltage outputs from a pair of said transistors, performing a comparison of said voltage outputs and, based on said comparison, outputting a binary digit (bit); and
    altering, by said computer, said initial design for said random number generator in order to generate an updated design for said random number generator by changing specifications for said transistors so that, for said transistors, said range for threshold voltage variation is widened as a function of an increase in random dopant fluctuation and so that said nominal threshold voltage is retained.

9. The design method of claim 8, said altering comprising, for each transistor, providing for complementary doping in at least one component of said transistor so as to increase said random dopant fluctuation without changing a net conductivity of said component.

10. The design method of claim 9, said component comprising a halo region.

11. The design method of claim 9, said component comprising a channel region.

12. The design method of claim 9, said component comprising a source/drain region.

13. The design method of claim 8, said altering comprising, for each transistor, providing for lateral dopant non-uniformity between a channel region and at least one halo region adjacent to said channel region so as to increase said random dopant fluctuation.

14. The design method of claim 13, said providing for lateral dopant non-uniformity comprising any one of:
    specifying different levels of a same type conductivity for said channel region and said halo region; and
    specifying different type conductivities for said channel region and said halo region.

15. A transistor comprising:
    source/drain regions having a first type conductivity;
    a channel region between said source/drains; and
    a halo region between said channel region and one of said source/drain regions, said halo region being doped with both a first type conductivity dopant and a second type conductivity dopant different from said first type conductivity dopant such that said halo region has a second type conductivity.

16. The transistor of claim 15, said channel region being doped with said second conductivity type dopant such that said channel region has a lower level of said second type conductivity than said halo region.

17. The transistor of claim 15, said channel region being doped with said first type conductivity dopant and said second type conductivity dopant such that said channel region has a lower level of said second type conductivity than said halo region.

18. The transistor of claim 15, said channel region being doped with said first type conductivity dopant such that said channel region has said first type conductivity at a lower level than said source/drain regions.

19. The transistor of claim 15, said source/drain regions being doped with said first type conductivity dopant and said second type conductivity dopant such that said source/drain regions have said first type conductivity.

20. The transistor of claim 15, further comprising a gate structure above said channel region, said gate structure comprising a polysilicon gate conductor layer doped with said first type conductivity dopant and said second type conductivity dopant such that said polysilicon gate conductor layer has said first type conductivity.

21. A random number generator comprising:
multiple pairs of transistors, each transistor comprising:
source/drain regions having a first type conductivity;
a channel region between said source/drains; and
a halo region between said channel region and one of said source/drain regions, said halo region being doped with a first type conductivity dopant and a second type conductivity dopant such that said halo region has said second type conductivity; and
a comparator receiving voltage outputs from a pair of said transistors, performing a comparison of said voltage outputs and, based on said comparison, outputting a binary digit (bit).

22. The random number generator of claim 21, said channel region being doped with said second conductivity type dopant such that said channel region has a lower level of said second type conductivity than said halo region.

23. The random number generator of claim 21, said channel region being doped with said first type conductivity dopant and said second type conductivity dopant such that said channel region has a lower level of said second type conductivity than said halo region.

24. The random number generator of claim 21, said channel region being doped with said first type conductivity dopant such that said channel region has said first type conductivity at a lower level than said source/drain regions.

25. The random number generator of claim 21, each transistor further comprising a gate structure above said channel region, said gate structure comprising a polysilicon gate conductor layer doped with said first type conductivity dopant and said second type conductivity dopant such that said polysilicon gate conductor layer has said first type conductivity.

* * * * *